US008986464B2

(12) United States Patent
Watanabe

(10) Patent No.: US 8,986,464 B2
(45) Date of Patent: Mar. 24, 2015

(54) SEMICONDUCTOR SUBSTRATE AND METHOD FOR PRODUCING SEMICONDUCTOR SUBSTRATE

(75) Inventor: Yukimune Watanabe, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 39 days.

(21) Appl. No.: 13/417,704

(22) Filed: Mar. 12, 2012

(65) Prior Publication Data
US 2012/0235163 A1 Sep. 20, 2012

(30) Foreign Application Priority Data

Mar. 17, 2011 (JP) ................. 2011-059273

(51) Int. Cl.
| H01L 29/16 | (2006.01) |
| C30B 29/36 | (2006.01) |
| C30B 25/04 | (2006.01) |
| C30B 25/18 | (2006.01) |
| H01L 21/02 | (2006.01) |

(52) U.S. Cl.
CPC .... *H01L 21/02529* (2013.01); *H01L 21/02381* (2013.01); *H01L 21/0262* (2013.01); *H01L 21/02639* (2013.01); *H01L 21/02647* (2013.01); *C30B 25/04* (2013.01); *C30B 25/183* (2013.01); *C30B 29/36* (2013.01)
USPC .......... 148/33.3; 438/492; 438/503; 438/507; 252/62.3 C; 148/33.4; 148/33.5; 29/25.02; 257/77; 117/95; 117/106

(58) Field of Classification Search
USPC ............................................ 257/77; 438/563
See application file for complete search history.

(56) References Cited

U.S. PATENT DOCUMENTS

| 3,481,781 A | * | 12/1969 | Werner ......................... 438/784 |
| 4,433,008 A | * | 2/1984 | Schnable et al. ............. 438/563 |
| 4,855,254 A | * | 8/1989 | Eshita et al. .................... 117/94 |
| 5,266,127 A | * | 11/1993 | Imaizumi et al. .............. 117/91 |
| 5,341,000 A | * | 8/1994 | Nii .................................. 257/77 |
| 5,859,458 A | * | 1/1999 | Hsueh et al. .................. 257/347 |
| 5,977,000 A | * | 11/1999 | Sato et al. ....................... 501/39 |
| 5,994,209 A | | 11/1999 | Yieh et al. |
| 6,020,270 A | * | 2/2000 | Wong et al. ................... 438/719 |

(Continued)

FOREIGN PATENT DOCUMENTS

| JP | 10-189467 A | 7/1998 |
| JP | A-11-181567 | 7/1999 |

(Continued)

OTHER PUBLICATIONS

Mikio Hayasaka Silica Glass Co., Ltd,; 1967, vol. 16, No. 9, p. 991-1008.

(Continued)

*Primary Examiner* — Jarrett Stark
*Assistant Examiner* — Charles N Ausar-El
(74) *Attorney, Agent, or Firm* — Oliff PLC

(57) ABSTRACT

A semiconductor substrate includes: single crystal silicon; a mask material formed on a surface of the single crystal silicon and having an opening; a silicon carbide film formed on a portion exposed in the opening of the single crystal silicon; and a single crystal silicon carbide film formed so as to cover the silicon carbide film and the mask material. The mask material has a viscosity of $10^5$ Pa·S or more and $10^{14.5}$ Pa·S or less in a temperature range of 950 to 1400° C.

9 Claims, 9 Drawing Sheets

(56) References Cited

U.S. PATENT DOCUMENTS

| | | | |
|---|---|---|---|
| 6,051,849 A * | 4/2000 | Davis et al. | 257/103 |
| 6,099,647 A | 8/2000 | Yieh et al. | |
| 6,328,796 B1 * | 12/2001 | Kub et al. | 117/94 |
| 6,348,096 B1 | 2/2002 | Sunakawa et al. | |
| 6,465,325 B2 * | 10/2002 | Ridley et al. | 438/428 |
| 6,890,833 B2 * | 5/2005 | Belyansky et al. | 438/426 |
| 7,009,209 B2 * | 3/2006 | Casady et al. | 257/77 |
| 7,125,815 B2 * | 10/2006 | Vaartstra | 438/784 |
| 7,358,160 B2 | 4/2008 | Li et al. | |
| 7,615,468 B2 * | 11/2009 | Boussagol et al. | 438/459 |
| 7,723,729 B2 | 5/2010 | Li et al. | |
| 7,807,535 B2 * | 10/2010 | Ramaswamy et al. | 438/269 |
| 7,960,736 B2 * | 6/2011 | Gadkaree et al. | 257/77 |
| 8,026,517 B2 * | 9/2011 | Chiu et al. | 257/51 |
| 2002/0066403 A1 | 6/2002 | Sunakawa et al. | |
| 2006/0186397 A1 * | 8/2006 | Ghyselen et al. | 257/11 |
| 2006/0194388 A1 * | 8/2006 | Hashimoto | 438/257 |
| 2007/0117366 A1 * | 5/2007 | Kordesch et al. | 438/597 |
| 2007/0166962 A1 * | 7/2007 | Ramaswamy et al. | 438/479 |
| 2007/0181954 A1 * | 8/2007 | Oikawa | 257/382 |
| 2007/0275254 A1 * | 11/2007 | Nagata | 428/447 |
| 2007/0275569 A1 * | 11/2007 | Moghadam et al. | 438/781 |
| 2007/0278574 A1 | 12/2007 | Hsu et al. | |
| 2009/0294773 A1 * | 12/2009 | Ellison | 257/72 |
| 2010/0087049 A1 * | 4/2010 | Kononchuk | 438/478 |
| 2011/0294245 A1 * | 12/2011 | Guenard et al. | 438/46 |
| 2012/0248463 A1 * | 10/2012 | Zhang | 257/77 |

FOREIGN PATENT DOCUMENTS

| | | |
|---|---|---|
| JP | 2001-148348 A | 5/2001 |
| JP | 2002-137994 A | 5/2002 |
| JP | A-2007-326771 | 12/2007 |
| WO | WO2010103356 A1 * | 9/2010 |

OTHER PUBLICATIONS

Eguchi Kiyohisa Glass handbook Asakura Publishing Co., Ltd. Sep. 30, 1975 p. 94-103.

* cited by examiner

SEMICONDUCTOR SUBSTRATE AND METHOD FOR PRODUCING SEMICONDUCTOR SUBSTRATE

BACKGROUND

1. Technical Field

The present invention relates to a semiconductor substrate and a method for producing a semiconductor substrate.

2. Related Art

Silicon carbide (SiC) which is a wide band gap semiconductor has a band gap twice or more than twice as wide as that of silicon (Si) in the related art and has attracted attention as a material for high-pressure resistant devices. Since the crystal formation temperature of SiC is higher than that of Si, it is difficult to form a single crystal ingot by a pulling method from a liquid phase, and a single crystal ingot is formed by a sublimation method. However, it is very difficult to form a SiC substrate having a large diameter and few crystal defects by a sublimation method. Therefore, the diameter of a currently available SiC substrate is from 3 to 4 inches, and also the price thereof is very high.

As the types of SiC, there are cubic silicon carbide (3C-SiC), hexagonal silicon carbide (4H-SiC, 6H-SiC), and the like divided depending on the crystal structure. Among these, SiC having a cubic crystal structure (3C-SiC) can be formed at a relatively low temperature, and can be epitaxially grown directly on a Si substrate. Therefore, a heteroepitaxial technique in which the crystal of 3C-SiC is grown on a surface of a Si substrate as a method for increasing the diameter of a SiC substrate has been studied. However, the lattice constants of Si and 3C-SiC are 0.543 nm and 0.436 nm, respectively, and there is an about 20% difference therebetween. Further, Si and 3C-SiC are also different in thermal expansion coefficient, and therefore, it is difficult to obtain a high-quality epitaxial film with few crystal defects.

Techniques for solving such a problem have been studied. For example, JP-A-11-181567 describes the following technique. After a mask layer is formed on a surface of a substrate for use in the growth of silicon carbide, openings are formed in the mask layer so as to expose portions of the surface of the substrate, and single crystal silicon carbide is epitaxially grown. The height of each opening is set to a value $2^{1/2}$ times or more the width of the opening and also exceeding the thickness of single crystal silicon carbide to be formed.

However, in a process in which single crystal silicon carbide is epitaxially grown and the temperature is returned to room temperature, it is difficult to suppress stress caused by a difference in thermal expansion coefficient between the substrate and the single crystal silicon carbide. If stress is caused by a difference in thermal expansion coefficient, crystal defects may occur in a single crystal silicon carbide film.

SUMMARY

An advantage of some aspects of the invention is to provide a semiconductor substrate capable of forming a high-quality single crystal silicon carbide film with few crystal defects and a method for producing such a semiconductor substrate are provided.

An aspect of the invention is directed to a semiconductor substrate including: single crystal silicon; a mask material formed on a surface of the single crystal silicon and having an opening; a silicon carbide film formed on a portion of the single crystal silicon exposed in the opening; and a single crystal silicon carbide film formed so as to cover the silicon carbide film and the mask material, wherein the mask material has a viscosity of $10^5$ Pa·S or more and $10^{14.5}$ Pa·S or less in a temperature range of 950 to 1400° C.

Another aspect of the invention is directed to a semiconductor substrate including: single crystal silicon; a silicon carbide film formed on a surface of the single crystal silicon; a mask material formed on a surface of the silicon carbide film and having an opening; and a single crystal silicon carbide film formed so as to cover the silicon carbide film and the mask material, wherein the mask material has a viscosity of $10^5$ Pa·S or more and $10^{14.5}$ Pa·S or less in a temperature range of 950 to 1400° C.

In the semiconductor substrate according to the aspect of the invention, planar defects occurring in the interface between the single crystal silicon and the single crystal silicon carbide film propagate into an upper layer accompanying the growth of single crystal silicon carbide and reach a side wall of the opening of the mask material and disappear. Further, the viscosity of the mask material is decreased in a temperature range of 950 to 1400° C. (for example, a temperature range in which a single crystal silicon carbide film is formed), and therefore, stress caused by a difference in the thermal expansion coefficient of the single crystal silicon carbide film can be absorbed by the mask material. Further, since the viscosity of the mask material is low, at the time of completion of the process, stress due to a difference in the thermal expansion coefficient of the single crystal silicon carbide film occurring when the temperature of the substrate is decreased can be also absorbed by the mask material. Accordingly, a high-quality single crystal silicon carbide film with few crystal defects can be formed.

In the semiconductor substrate according to the aspect of the invention, the mask material may be formed of a silicon oxide film containing phosphorus in an amount ranging from 1 to 8 wt %.

According to this configuration, the viscosity of the mask material is reliably decreased in a temperature range of 950 to 1400° C. If the content of phosphorus is in the above-described range, a high-quality single crystal silicon carbide film with few crystal defects can be reliably formed.

Still another aspect of the invention is directed to the method for producing a semiconductor substrate including: forming a mask material on a surface of single crystal silicon; forming an opening in the mask material, thereby exposing a portion of the single crystal silicon; forming silicon carbide film on the portion of the single crystal silicon; and forming a single crystal silicon carbide film covering the silicon carbide film and the mask material by epitaxially growing single crystal silicon carbide in a temperature range of 950 to 1400° C. using the silicon carbide film as a starting point, wherein the mask material has a viscosity of $10^5$ Pa·S or more and $10^{14.5}$ Pa·S or less in a temperature range of 950 to 1400° C.

According to the method for producing a semiconductor substrate of the aspect of the invention, planar defects occurring in the interface between the single crystal silicon and the single crystal silicon carbide film propagate into an upper layer accompanying the growth of single crystal silicon carbide and reach a side wall of the opening of the mask material and disappear. Further, the viscosity of the mask material is decreased in a temperature range of 950 to 1400° C. (for example, a temperature range in which a single crystal silicon carbide film is formed), and therefore, stress caused by a difference in the thermal expansion coefficient of the single crystal silicon carbide film can be absorbed by the mask material. Further, since the viscosity of the mask material is low, at the time of completion of the process, stress due to a difference in the thermal expansion coefficient of the single crystal silicon carbide film occurring when the temperature of the substrate is decreased can be also absorbed by the mask material. Accordingly, a high-quality single crystal silicon carbide film with few crystal defects can be formed. Also, if a temperature range in which a single crystal silicon carbide film is epitaxially grown is within this temperature range, a high-quality single crystal silicon carbide film with few crystal defects can be reliably formed.

Yet another aspect of the invention is directed to the method for producing a semiconductor substrate including: forming a silicon oxide film on a surface of single crystal silicon; forming an opening in the silicon oxide film, thereby exposing a portion of the single crystal silicon; forming a silicon carbide film on the portion of the single crystal silicon; epitaxially growing single crystal silicon carbide using the silicon carbide film as a starting point, and stopping the epitaxial growth of the single crystal silicon carbide in a state that a portion of the surface of the silicon oxide film is exposed; forming a mask material by doping the silicon oxide film with an impurity; and forming a single crystal silicon carbide film covering the mask material in a temperature range of 950 to 1400° C. by restarting the epitaxial growth of the single crystal silicon carbide after the forming of the mask material, wherein the mask material has a viscosity of $10^5$ Pa·S or more and $10^{14.5}$ Pa·S or less in a temperature range of 950 to 1400° C.

According to the method for producing a semiconductor substrate of the aspect of the invention, in the course of forming the silicon oxide film into the mask material (decreasing the viscosity) on the way to the formation of the single crystal silicon carbide film, at the initial stage of epitaxially growing the single crystal silicon carbide film, stress caused by a difference in the thermal expansion coefficient of the single crystal silicon carbide film can be absorbed by the mask material. Further, since the viscosity of the mask material is low, at the time of completion of the process, stress due to a difference in the thermal expansion coefficient of the single crystal silicon carbide film occurring when the temperature of the substrate is decreased can be also absorbed by the mask material. Accordingly, a high-quality single crystal silicon carbide film with few crystal defects can be formed.

Still yet another aspect of the invention is directed to the method for producing a semiconductor substrate including: forming a silicon carbide film on a surface of single crystal silicon; forming a mask material on a surface of the silicon carbide film; forming an opening in the mask material, thereby exposing a portion of the silicon carbide film; and forming a single crystal silicon carbide film covering the silicon carbide film and the mask material by epitaxially growing single crystal silicon carbide in a temperature range of 950 to 1400° C. using the portion of the silicon carbide film as a starting point, wherein the mask material has a viscosity of $10^5$ Pa·S or more and $10^{14.5}$ Pa·S or less in a temperature range of 950 to 1400° C.

According to the method for producing a semiconductor substrate of the aspect of the invention, planar defects occurring in the interface between the single crystal silicon and the single crystal silicon carbide film propagate into an upper layer accompanying the growth of single crystal silicon carbide and reach a side wall of the opening of the mask material and disappear. Further, the viscosity of the mask material is decreased in a temperature range of 950 to 1400° C. (for example, a temperature range in which a single crystal silicon carbide film is formed), and therefore, stress caused by a difference in the thermal expansion coefficient of the single crystal silicon carbide film can be absorbed by the mask material. Further, since the viscosity of the mask material is low, at the time of completion of the process, stress due to a difference in the thermal expansion coefficient of the single crystal silicon carbide film occurring when the temperature of the substrate is decreased can be also absorbed by the mask material. Accordingly, a high-quality single crystal silicon carbide film with few crystal defects can be formed. Also, if a temperature range in which a single crystal silicon carbide film is epitaxially grown is within this temperature range, a high-quality single crystal silicon carbide film with few crystal defects can be reliably formed.

Further another aspect of the invention is directed to a method for producing a semiconductor substrate including: forming a silicon carbide film on a surface of single crystal silicon; forming a silicon oxide film on a surface of the silicon carbide film; forming an opening in the silicon oxide film, thereby exposing a portion of the silicon carbide film; epitaxially growing single crystal silicon carbide using the portion of the silicon carbide film as a starting point and stopping the epitaxial growth of the single crystal silicon carbide in a state that a portion of the surface of the silicon oxide film is exposed; forming a mask material by doping the silicon oxide film with an impurity; and forming a single crystal silicon carbide film covering the mask material in a temperature range of 950 to 1400° C. by restarting the epitaxial growth of the single crystal silicon carbide after the forming of the mask material, wherein the mask material has a viscosity of $10^5$ Pa·S or more and $10^{19.5}$ Pa·S or less in a temperature range of 950 to 1400° C.

According to the method for producing a semiconductor substrate of the aspect of the invention, in the course of forming the silicon oxide film into the mask material (decreasing the viscosity) on the way to the formation of the single crystal silicon carbide film, at the initial stage of epitaxially growing the single crystal silicon carbide film, stress caused by a difference in the thermal expansion coefficient of the single crystal silicon carbide film can be absorbed by the mask material. Further, since the viscosity of the mask material is low, at the time of completion of the process, stress due to a difference in the thermal expansion coefficient of the single crystal silicon carbide film occurring when the temperature of the substrate is decreased can be also absorbed by the mask material. Accordingly, a high-quality single crystal silicon carbide film with few crystal defects can be formed.

Further, in the method for producing a semiconductor substrate according to the aspect of the invention, the mask material may be formed of a silicon oxide film containing phosphorus in an amount ranging from 1 to 8 wt %.

With the use of this method, the viscosity of the mask material is reliably decreased in a temperature range of 950 to 1400° C. If the content of phosphorus is in the above-described range, a high-quality single crystal silicon carbide film with few crystal defects can be reliably formed.

Further, in the method for producing a semiconductor substrate according to the aspect of the invention, the forming of the mask material may include: forming an impurity-containing layer doped with an impurity and covering the silicon oxide film; forming the mask material by diffusing the doped impurity in the impurity-containing layer into the silicon oxide film by heating the impurity-containing layer; and removing the impurity-containing layer, thereby exposing the mask material.

According to this configuration, the impurity is selectively diffused into the silicon oxide film, and therefore, it is possible to prevent the single crystal silicon carbide from being doped with the impurity during the epitaxial growth. Accordingly, a high-purity single crystal silicon carbide film containing no impurities can be formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. The embodiments each show an aspect of the invention and do not limit the invention and can be arbitrarily changed within the scope of the technical idea of the invention. Further, in the following drawings, for a better understanding of each structure, scale, number, and the like in each structure are different from those in the actual structure.

First Embodiment

Figure 1:
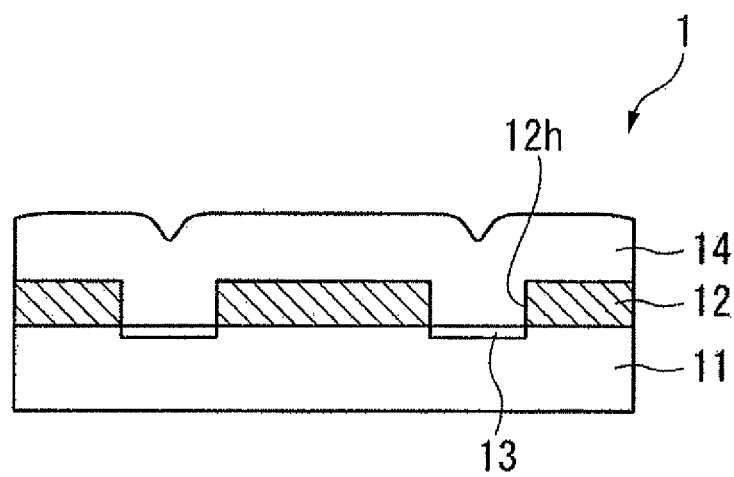
FIG. 1 is a schematic view showing a structure of a semiconductor substrate according to a first embodiment of the invention.

FIG. 1 is a schematic view showing a structure of a semiconductor substrate 1 according to a first embodiment of the invention.

As shown in FIG. 1, the semiconductor substrate 1 is provided with: single crystal silicon 11; a mask material 12 formed on a surface of the single crystal silicon 11 and having openings 12h; silicon carbide films 13 formed on portions of the single crystal silicon 11 exposed in the openings 12h; and a single crystal silicon carbide film 14 formed so as to cover the silicon carbide films 13 exposed in the openings 12h and the mask material 12.

The single crystal silicon 11 is formed by, for example, slicing a silicon single crystal ingot pulled by a Czochralski (CZ) method, followed by polishing. The surface of the single crystal silicon 11 forms a crystal plane represented by a Miller index (100). Further, an offset substrate in which a crystal axis of the crystal plane is tilted by several degrees may be used.

In this embodiment, a silicon single crystal substrate is used as the single crystal silicon 11, however, the single crystal silicon 11 is not limited thereto. For example, one obtained by forming a single crystal silicon film on a substrate made of quartz, sapphire, or stainless steel may be used. In this specification, a silicon single crystal substrate or, for example, one obtained by forming a single crystal silicon film on a substrate made of quartz, sapphire, or stainless steel is referred to as "single crystal silicon".

Further, the surface of the single crystal silicon 11 forms a crystal plane represented by a Miller index (100), however, other than the (100) plane, the surface may form a (111) plane tilted by 54.73 degrees with respect to the (100) plane. The lattice constant of such single crystal silicon is 0.543 nm.

The mask material 12 is formed on a surface of the single crystal silicon 11. In the mask material 12, a plurality of openings 12h are formed so as to expose portions of the surface of the single crystal silicon 11. The mask material 12 is formed such that an impurity is contained in a silicon oxide film in a predetermined amount. In this embodiment, the mask material 12 is formed such that phosphorus is contained in a silicon oxide film in an amount ranging from 1 to 8 wt %.

The impurity is not limited to phosphorus, and for example, boron can be used. For example, the mask material may be formed such that boron is contained in a silicon oxide film in an amount ranging from 1 to 4 wt %. Further, the mask material may be formed such that both boron and phosphorus are contained in a silicon oxide film (boron phosphorus silicon glass (BPSG)). The concentrations of boron and phosphorus contained in BPSG are, for example, in a range of 1 to 4 wt % and in a range of 4 to 6 wt %, respectively.

The silicon carbide films 13 are formed on the portions exposed in the openings 12h of the single crystal silicon 11. Each silicon carbide film 13 is a silicon carbide (3C-SiC) single crystal or polycrystal layer. The silicon carbide film 13 suppresses sublimation of silicon from the surface of the single crystal silicon 11 when forming the single crystal silicon carbide film 14, and also has a function of reducing lattice mismatch between the single crystal silicon and the single crystal silicon carbide film 14 and suppressing the occurrence of dislocation defects in the single crystal silicon carbide film 14 attributed to a carbonization treatment of a surface of the single crystal silicon 11. It may suffice that each silicon carbide film 13 is formed to a thickness of at least one atom layer, and the thickness of the silicon carbide film 13 is set to, for example, 2 nm or more and 30 nm or less.

The single crystal silicon carbide film 14 is formed so as to cover the silicon carbide films 13 exposed in the openings 12h and the mask material 12. The single crystal silicon carbide film 14 is a semiconductor film formed by epitaxially growing cubic silicon carbide (3C-SiC). 3C-SiC has a wide band gap of 2.2 eV or more, and has a high thermal conductivity and a high electric breakdown field, and therefore is suitable as a wide band gap semiconductor for power devices. The single crystal silicon carbide film 14 composed of such 3C-SiC has a lattice constant of 0.436 nm.

Method for Producing Semiconductor Substrate

FIGS. 2A to 2E are process drawings showing a method for producing a semiconductor substrate according to this embodiment.

First, single crystal silicon 11 is provided and the single crystal silicon is placed in a vacuum chamber. Then, a heat treatment is performed in a vacuum atmosphere under the conditions that a treatment temperature is 750° C. and a treatment time is 5 minutes (see FIG. 2A). By this heat treatment, the surface of the single crystal silicon is cleaned and impurities attached thereto are removed. Subsequently, the treatment temperature is decreased to 600° C. In the following description, the temperature of the single crystal silicon is sometimes simply referred to as "substrate temperature".

Figure 2A:
FIGS. 2A to 2E are process drawings showing a method for producing a semiconductor substrate according to the first embodiment of the invention.
Figure 2B:
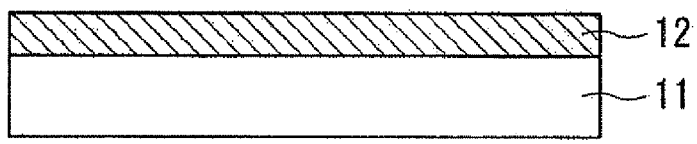

Subsequently, a mask material 12 is formed on a surface of the single crystal silicon 11 (a first step, see FIG. 2B). Here, by subjecting a surface of the single crystal silicon 11 to a thermal oxidation treatment using a thermal oxidation method, the mask material 12 is formed on a surface of the single crystal silicon 11. The film thickness of the mask material 12 is set to, for example, 5 to 200 nm. For example, the mask material 12 can be formed by doping a silicon oxide film with phosphorus by ion implantation or the like. The content of phosphorus in the mask material 12 is in a range of 1 to 8 wt %. If the content of phosphorus exceeds 8 wt %, an acid is formed, and therefore, such a content is not preferred. The silicon oxide film may be doped with boron.

Figure 2C:
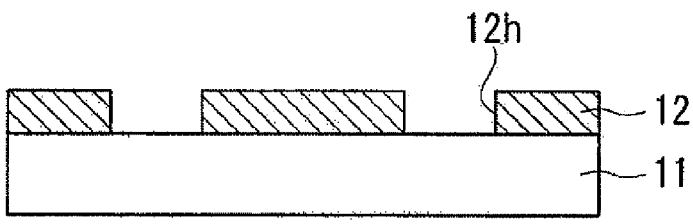

Subsequently, the mask material 12 is patterned to form openings 12h, thereby exposing portions of the surface of the single crystal silicon 11 (a second step, see FIG. 2C). For example, a resist is applied onto the mask material 12 and patterned by photolithography to obtain a desired pattern, for example, a line and space pattern. The resist patterned in this manner is used as a mask and the mask material 12 is etched. By doing this, the mask material 12 is patterned into a desired pattern shape, and portions of the surface of the single crystal silicon 11 are exposed in the openings 12h of the mask material 12.

Subsequently, the substrate temperature is adjusted to a temperature in a range of 600 to 800° C., and a raw material gas (a carbon material gas) for silicon carbide films 13 is introduced into the chamber while maintaining this adjusted substrate temperature. If the substrate temperature exceeds 800° C., the carbon material gas introduced in the vicinity of the surface of the single crystal silicon 11 is easily thermally decomposed or the like, and it becomes difficult to form a stable carbon material gas atmosphere, and therefore, such a substrate temperature is not preferred.

As the carbon material gas, a hydrocarbon gas is preferred, and for example, methane ($CH_4$), ethane ($C_2H_6$) acetylene ($C_2H_2$), ethylene ($C_2H_4$), propane ($C_3H_8$), normal butane (n-$C_4H_{10}$) isobutane (i-$C_4H_{10}$) neopentane (neo-$C_5H_{12}$) or the like is preferably used. These gases may be used such that only one kind is used alone or two or more kinds are used in admixture.

Figure 2D:
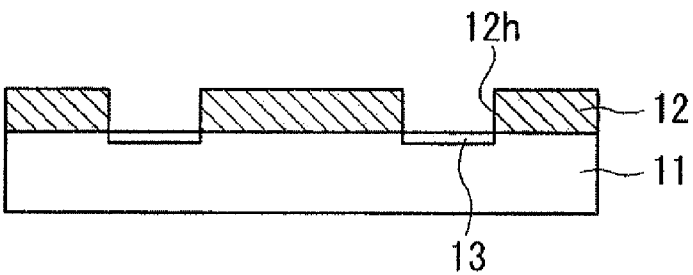
Figure 2E:
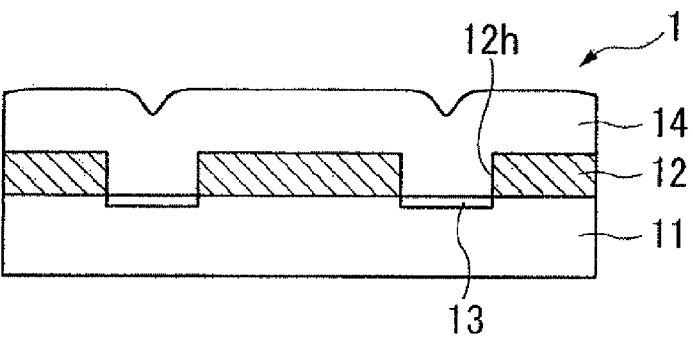

By doing this, the silicon carbide films 13 are formed in the portions exposed in the openings 12h of the single crystal silicon 11 (a third step, see FIG. 2D).

Subsequently, the single crystal silicon 11 is heated in the carbon material gas atmosphere and the substrate temperature is increased to a temperature at which a single crystal silicon carbide film is formed (hereinafter sometimes simply referred to as "carbonization treatment temperature"). The carbonization treatment temperature is adjusted to a temperature in a range of 950 to 1400° C. and the adjusted carbonization treatment temperature is maintained.

The viscosity of the mask material 12 is $10^5$ Pa·S or more and $10^{14.5}$ Pa·S or less when the carbonization treatment temperature is in a range of 950 to 1400° C.

If the carbonization treatment temperature is lower than 950° C., the carbonization of the surface of the single crystal silicon 11 by the carbon material gas is not sufficient, and as a result, a single crystal silicon carbide film 14 having high crystallinity cannot be formed on the surface of the single crystal silicon 11. Meanwhile if the carbonization treatment temperature exceeds 1400° C., the melting point (1410° C.) of silicon may be exceeded, and a problem arises that single crystal silicon melts. Incidentally, the lower limit viscosity ($10^5$ Pa·S) is a viscosity at which the mask material 12 is in a flowing state, and the upper limit viscosity ($10^{14.5}$ Pa·S) is a viscosity at which the viscous flow is no longer caused (a viscosity at which a strain of the mask material 12 cannot be removed).

Further, in this embodiment, the mask material 12 is doped with phosphorus in an amount ranging from 1 to 8 wt %, and the viscosity of the mask material 12 satisfies a value of $10^{7.6}$ Pa·S or more and $10^{13}$ Pa·S or less when the carbonization treatment temperature is in a range of 950 to 1400° C. Here, the lower limit viscosity ($10^{7.6}$ Pa·S) is a viscosity at which the mask material 12 is in a softened state, and the upper limit viscosity ($10^{13}$ Pa·S) is an upper limit viscosity when a strain of the mask material 12 is removed.

By doing this, single crystal silicon carbide is epitaxially grown using each of the silicon carbide films 13 exposed in the openings 12h as a starting point, whereby a single crystal silicon carbide film 14 covering the silicon carbide films 13 exposed in the openings 12h and the mask material 12 is formed (a fourth step, see FIG. 2F).

By the above steps, a semiconductor substrate 1 of this embodiment can be produced.

According to the semiconductor substrate 1 and the method for producing a semiconductor substrate of this embodiment, planar defects occurring in the interface between the single crystal silicon 11 and the single crystal silicon carbide film 14 propagate into an upper layer accompanying the growth of single crystal silicon carbide and reach a side wall of the opening 12h of the mask material 12 and disappear. Further, the viscosity of the mask material 12 is decreased in a temperature range of 950 to 1400° C. (for example, a temperature range in which the single crystal silicon carbide film 14 is formed), and therefore, stress caused by a difference in the thermal expansion coefficient of the single crystal silicon carbide film 14 can be absorbed by the mask material 12. Further, since the viscosity of the mask material 12 is low, at the time of completion of the process, stress due to a difference in the thermal expansion coefficient of the single crystal silicon carbide film 14 occurring when the substrate temperature is decreased can be also absorbed by the mask material 12. Accordingly, a high-quality single crystal silicon carbide film 14 with few crystal defects can be formed. Further, in the method for producing a semiconductor substrate, if the temperature range in which the single crystal silicon carbide film 14 is epitaxially grown is within the above-described range, a high-quality single crystal silicon carbide film 14 with few crystal defects can be reliably formed.

Further, the viscosity of the mask material 12 is reliably decreased in a temperature range of 950 to 1400° C. Accordingly, if the content of the doped impurity is in the above-described range, a high-quality single crystal silicon carbide film 14 with few crystal defects can be reliably formed.

First Modification Example

FIGS. 3A to 3D and FIGS. 4A to 4E are process drawings showing a first modification example of the method for producing a semiconductor substrate according to the first embodiment.

First, single crystal silicon 11 is provided and the single crystal silicon is placed in a vacuum chamber. Then, a heat treatment is performed in a vacuum atmosphere under the conditions that a treatment temperature is 750° C. and a treatment time is 5 minutes (see FIG. 3A). Subsequently, the treatment temperature is decreased to 600° C.

Figure 3A:
FIGS. 3A to 3D are process drawings showing a first modification example of the method for producing a semiconductor substrate according to the first embodiment of the invention.
Figure 3B:
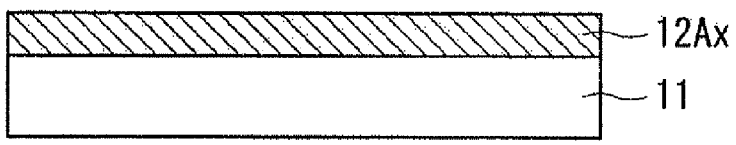

Subsequently, a silicon oxide film 12Ax is formed on a surface of the single crystal silicon 11 (a first step, see FIG. 3B). For example, by subjecting a surface of the single crystal silicon 11 to a thermal oxidation treatment using a thermal oxidation method, the silicon oxide film 12Ax is formed on a surface of the single crystal silicon 11.

Figure 3C:
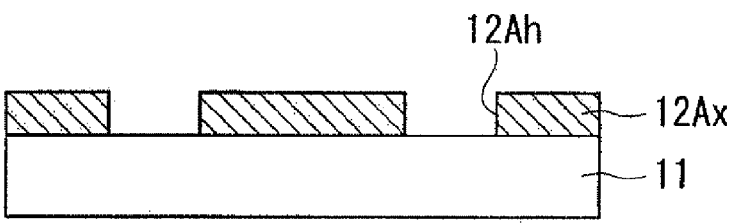
Figure 3D:
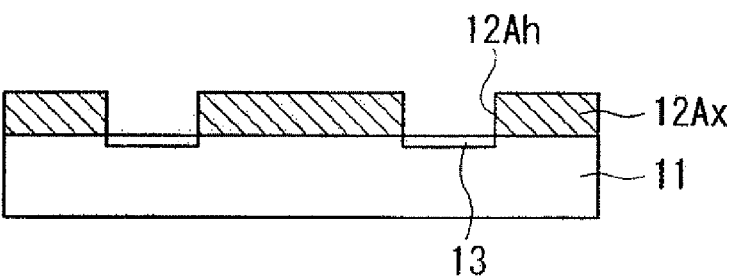

Subsequently, the silicon oxide film 12Ax is patterned to form openings 12Ah, thereby exposing portions of the surface of the single crystal silicon 11 (a second step, see FIG. 3C).

Subsequently, the substrate temperature is adjusted to a temperature in a range of 600 to 800° C., and a raw material gas (a carbon material gas) for silicon carbide films 13 is introduced into the chamber while maintaining this adjusted substrate temperature. By doing this, the silicon carbide films 13 are formed in the portions exposed in the openings 12Ah of the single crystal silicon 11 (a third step, see FIG. 3D).

Subsequently, the single crystal silicon 11 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained for a predetermined time.

Figure 4A:
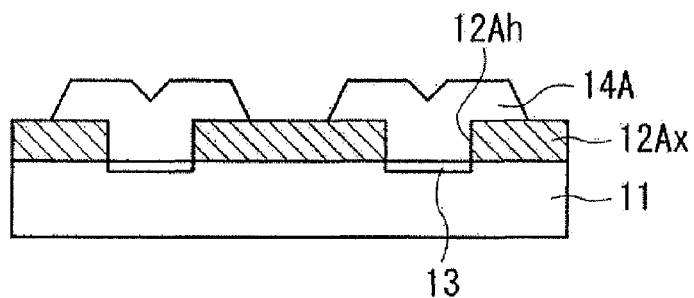
FIGS. 4A to 4E are process drawings showing the first modification example of the method for producing a semiconductor substrate continued from FIG. 3D.
Figure 4B:
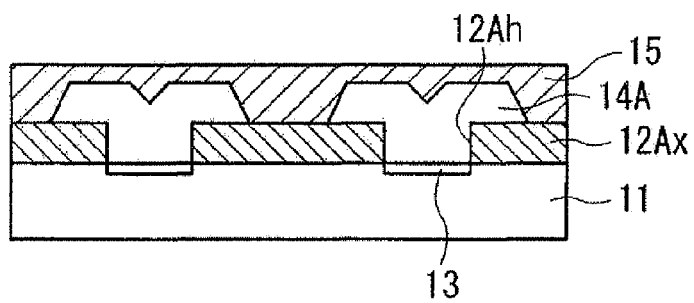
Figure 4C:
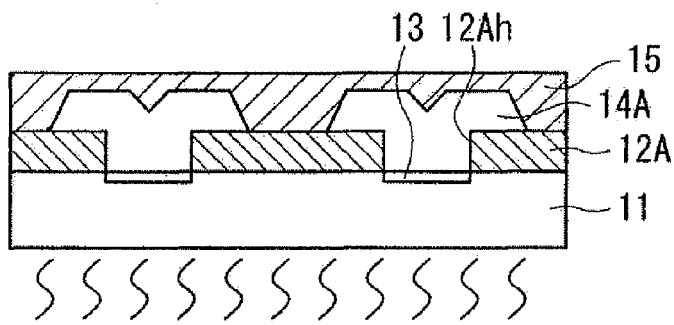
Figure 4D:
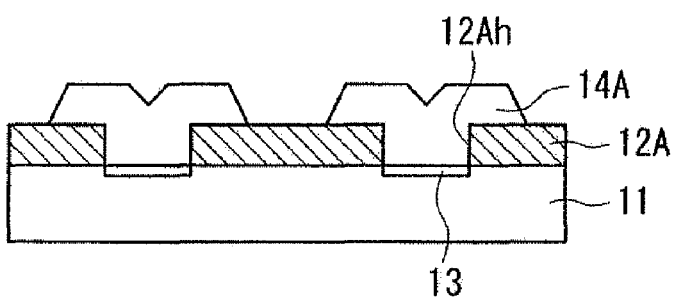

By doing this, single crystal silicon carbide is epitaxially grown using each of the silicon carbide films 13 exposed in the openings 12Ah as a starting point, and the epitaxial growth of the single crystal silicon carbide is stopped when the surface of the silicon oxide film 12Ax is in such a state that portions thereof are exposed (a fourth step, see FIG. 4A).

Subsequently, the silicon oxide film 12Ax is doped with an impurity (a fifth step). For example, the fifth step includes: a step of forming an impurity-containing layer 15 doped with an impurity so as to cover the silicon oxide film 12Ax after decreasing the substrate temperature to a predetermined temperature (a seventh step, see FIG. 4B); a step of forming a mask material 12A by diffusing the doped impurity in the impurity-containing layer 15 into the silicon oxide film 12Ax by heating the single crystal silicon 11 (an eighth step, see FIG. 4C); and a step of removing the impurity-containing layer 15, thereby exposing the mask material 12A (a ninth step, see FIG. 4D).

The impurity is phosphorus, and the impurity-containing layer 15 is formed such that phosphorus is contained in a silicon oxide film in an amount ranging from 1 to 8 wt %. Boron may be used as the impurity.

Then, the single crystal silicon 11 is heated in a carbon material gas atmosphere and the substrate temperature is increased to a carbonization treatment temperature. The carbonization treatment temperature is adjusted to temperature in a range of 950 to 1400° C. and the adjusted carbonization treatment temperature is maintained.

The viscosity of the mask material 12A is $10^5$ Pa·S or more and $10^{14.5}$ Pa·S or less when the carbonization treatment temperature is in a range of 950 to 1400° C. In this modification example, phosphorus is diffused into the silicon oxide film 12Ax in an amount ranging from 1 to 8 wt %, and therefore, the viscosity of the mask material 12A satisfies a value of $10^{7.6}$ Pa·S or more and $10^{13}$ Pa·S or less in a temperature range of 950 to 1400° C.

Figure 4E:
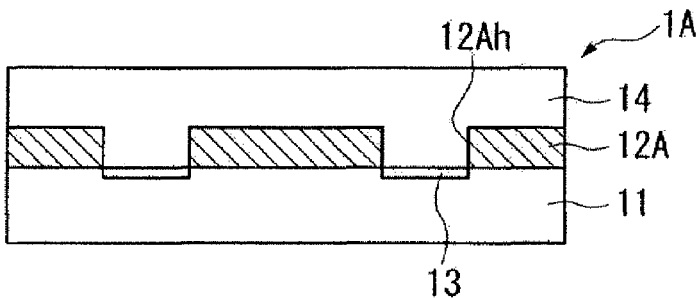

By doing this, the epitaxial growth of the single crystal silicon carbide 14A whose epitaxial growth was stopped is restarted, whereby a single crystal silicon carbide film 14 covering the mask material 12A is formed (a sixth step, see FIG. 4E).

By the above steps, a semiconductor substrate 1A of this modification example can be produced.

According to the method for producing a semiconductor substrate of this modification example, in the process of forming the silicon oxide film 12Ax into the mask material 12A (decreasing the viscosity) on the way to the formation of the single crystal silicon carbide film 14, at the initial stage of epitaxially growing the single crystal silicon carbide film 14, stress caused by a difference in the thermal expansion coefficient of the single crystal silicon carbide film 14 can be absorbed by the mask material 12A. Further, since the viscosity of the mask material 12A is low, at the time of completion of the process, stress due to a difference in the thermal expansion coefficient of the single crystal silicon carbide film 14 occurring when the substrate temperature is decreased can be also absorbed by the mask material 12A. Accordingly, a high-quality single crystal silicon carbide film 14 with few crystal defects can be formed.

Further, according to this method, the impurity is selectively doped into the silicon oxide film 12Ax, and therefore, it is possible to prevent the single crystal silicon carbide 14A from being doped with the impurity during the epitaxial growth. Accordingly, a high-purity single crystal silicon carbide film 14 containing no impurities can be formed.

Further, according to this method, the doped phosphorus in the impurity-containing layer 15 can be sufficiently diffused into the silicon oxide film 12Ax in the eighth step. Therefore, the viscosity of the mask material 12A can be reliably decreased in a temperature range of 950 to 1400° C. Accordingly, if the content of the doped impurity is in the above-described range, a high-quality single crystal silicon carbide film 14 with few crystal defects can be reliably formed.

Second Modification Example

Figure 5A:
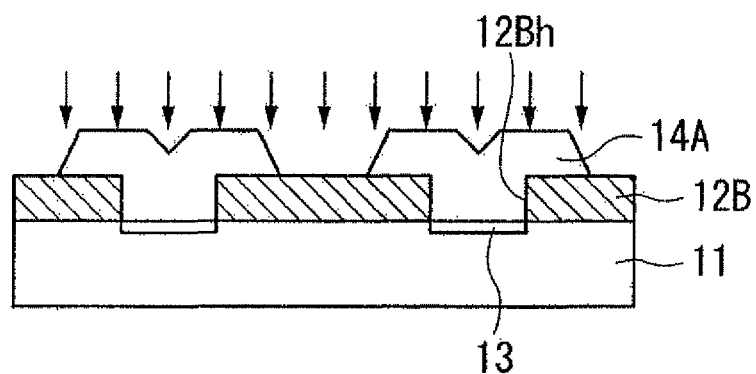
FIGS. 5A and 5B are process drawings showing a second modification example of the method for producing a semiconductor substrate according to the first embodiment of the invention.
Figure 5B:
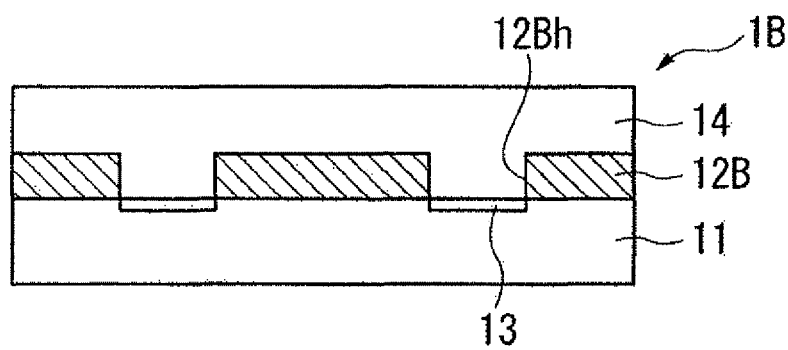

FIGS. 5A and 5B are process drawings showing a second modification example of the method for producing a semiconductor substrate according to the first embodiment.

The first step to the fourth step of the method for producing a semiconductor substrate according to this modification example are the same as the first step to the fourth step of the method for producing a semiconductor substrate according to the first modification example described above (FIGS. 3A to 3D and FIG. 4A), and therefore, the detailed description thereof is omitted.

Subsequent to the fourth step, a silicon oxide film is doped with an impurity (a fifth step, see FIG. 5A). For example, in the fifth step, a mask material 12B can be formed by doping the silicon oxide film with phosphorus in an amount ranging from 1 to 8 wt % by ion implantation or the like. Boron may be used as the impurity.

Then, the single crystal silicon 11 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained.

The viscosity of the mask material 12B is $10^5$ Pa·S or more and $10^{14.5}$ Pa·S or less when the carbonization treatment temperature is in a range of 950 to 1400° C. In this modification example, phosphorus is contained in the mask material 12B in a range of 1 to 8 wt %, and therefore, the viscosity of the mask material 12B satisfies a value of $10^{7.6}$ Pa·S or more and $10^{13}$ Pa·S or less in a temperature range of 950 to 1400° C.

By doing this, the epitaxial growth of the single crystal silicon carbide 14A whose epitaxial growth was stopped is restarted, whereby a single crystal silicon carbide film 14 covering the mask material 12B is formed (a sixth step, see FIG. 5B).

By the above steps, a semiconductor substrate 1B of this modification example can be produced.

According to the method for producing a semiconductor substrate of this modification example, the viscosity of the mask material 12B can be reliably decreased in a temperature range of 950 to 1400° C. Accordingly, if the content of the doped impurity is in the above-described range, a high-quality single crystal silicon carbide film 14 with few crystal defects can be reliably formed. Further, an impurity may be sometimes doped also into the single crystal silicon carbide 14A during the epitaxial growth, however, such a case is effective in a case of forming a layer using a layer containing an impurity on the single crystal silicon carbide film 14 or a case of laminating the same type of layer thereon.

Second Embodiment

Figure 6:
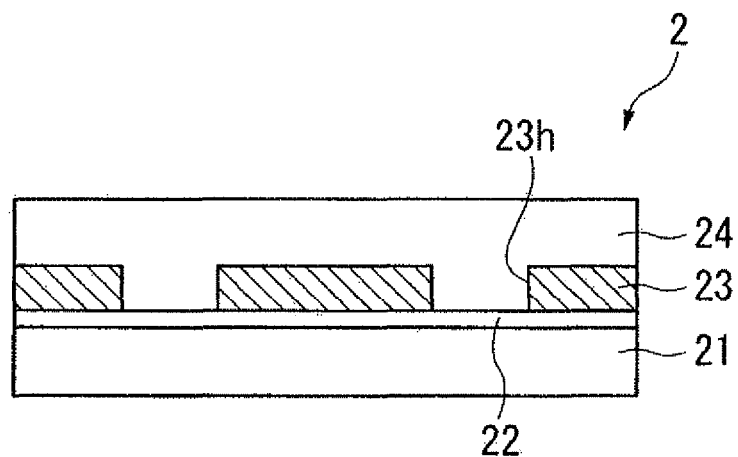
FIG. 6 is a schematic view showing a structure of a semiconductor substrate according to a second embodiment of the invention.

FIG. 6 is a schematic view showing a structure of a semiconductor substrate 2 according to a second embodiment of the invention.

As shown in FIG. 6, the semiconductor substrate 2 is provided with: single crystal silicon 21; a silicon carbide film 22 formed on a surface of the single crystal silicon 21; a mask material 23 formed on a surface of the silicon carbide film 22 and having openings 23h; and a single crystal silicon carbide film 24 formed so as to cover the silicon carbide film 22 exposed in the openings 23h and the mask material 23.

The single crystal silicon 21 is formed by, for example, slicing a silicon single crystal ingot pulled by a Czochralski (CZ) method, followed by polishing. The surface of the single crystal silicon 21 forms a crystal plane represented by a Miller index (100).

The silicon carbide film 22 is formed on a surface of the single crystal silicon 21. The silicon carbide film 22 is a silicon carbide (3C-SiC) single crystal or polycrystal layer. The silicon carbide film 22 suppresses sublimation of silicon from the surface of the single crystal silicon 21 when forming the single crystal silicon carbide film 24, and also has a function of reducing lattice mismatch between the single crystal silicon 21 and the single crystal silicon carbide film 24 and suppressing the occurrence of dislocation defects in the single crystal silicon carbide film 24 attributed to a carbonization treatment of a surface of the single crystal silicon 21. It may suffice that the silicon carbide film 22 is formed to a thickness of at least one atom layer, and the thickness of the silicon carbide film 22 is set to, for example, 2 nm or more and 30 nm or less.

The mask material 23 is formed on a surface of the silicon carbide film 22. In the mask material 23, a plurality of openings 23h are formed so as to expose portions of the surface of the single crystal silicon 21. The mask material 23 is formed such that an impurity is contained in a silicon oxide film in a predetermined amount. In this embodiment, the mask material 23 is formed such that phosphorus is contained in a silicon oxide film in an amount ranging from 1 to 8 wt %. The impurity is not limited to phosphorus, and for example, boron can be used.

The single crystal silicon carbide film 24 is formed so as to cover the silicon carbide film 22 exposed in the openings 23h and the mask material 23. The single crystal silicon carbide film 24 is a semiconductor film formed by epitaxially growing cubic silicon carbide (3C-SiC).

Method for Producing Semiconductor Substrate

FIGS. 7A to 7D are process drawings showing a method for producing a semiconductor substrate according to this embodiment.

First, single crystal silicon 21 is provided and the single crystal silicon is placed in a vacuum chamber. Then, a heat treatment is performed in a vacuum atmosphere under the conditions that a treatment temperature is 750° C. and a treatment time is 5 minutes. By this heat treatment, the surface of the single crystal silicon is cleaned and impurities attached thereto are removed. Subsequently, the treatment temperature is decreased to 600° C. In the following description, the temperature of the single crystal silicon is sometimes simply referred to as "substrate temperature".

Subsequently, the substrate temperature is adjusted to a temperature in a range of 600 to 800° C., and a raw material gas (a carbon material gas) for a silicon carbide film 22 is introduced into the chamber while maintaining this adjusted substrate temperature.

As the carbon material gas, a hydrocarbon gas is preferred, and for example, methane ($CH_4$), ethane ($C_2H_6$), acetylene ($C_2H_2$), ethylene ($C_2H_4$), propane ($C_3H_8$), normal butane (n-$C_4H_{10}$), isobutane (i-$C_4H_{10}$), neopentane (neo-$C_5H_{12}$), or the like is preferably used. These gases may be used such that only one kind is used alone or two or more kinds are used in admixture.

Figure 7A:
FIGS. 7A to 7D are process drawings showing a method for producing a semiconductor substrate according to the second embodiment of the invention.

By doing this, the silicon carbide film 22 is formed on a surface of the single crystal silicon 21 (a first step, see FIG. 7A).

Figure 7B:
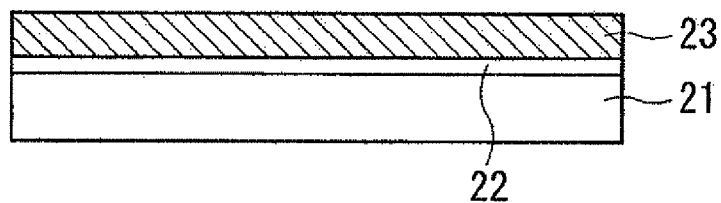

Subsequently, a mask material 23 is formed on a surface of the silicon carbide film 22 (a second step, see FIG. 7B). For example, the mask material 23 can be formed by doping a silicon oxide film with phosphorus by ion implantation or the like. The content of phosphorus in the mask material 23 is in a range of 1 to 8 wt %. The silicon oxide film may be doped with boron.

Figure 7C:
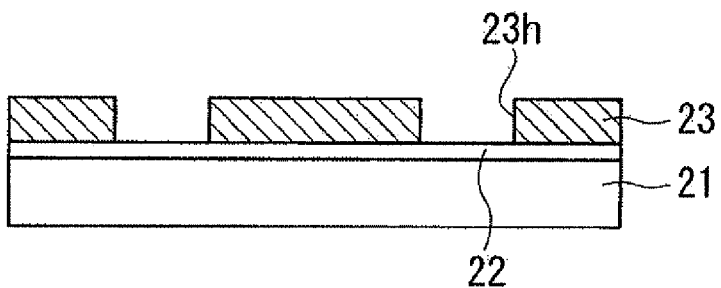

Subsequently, the mask material 23 is patterned to form openings 23h, thereby exposing portions of the surface of the silicon carbide film 22 (a third step, see FIG. 7C). For example, a resist is applied onto the mask material 23 and patterned by photolithography to obtain a desired pattern, for example, a line and space pattern. The resist patterned in this manner is used as a mask and the mask material 23 is etched. By doing this, the mask material 23 is patterned into a desired pattern shape, and portions of the surface of the silicon carbide film 22 are exposed in the openings 23h of the mask material 23.

Subsequently, the single crystal silicon 21 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained.

The viscosity of the mask material 23 is $10^5$ Pa·S or more and $10^{14.5}$ Pa·S or less when the carbonization treatment temperature is in a range of 950 to 1400° C. In this embodiment, the mask material 23 is doped with phosphorus in an amount ranging from 1 to 8 wt %, and the viscosity of the mask material 23 satisfies a value of $10^{7.6}$ Pa·S or more and $10^{13}$ Pa·S or less in a temperature range of 950 to 1400° C.

Figure 7D:
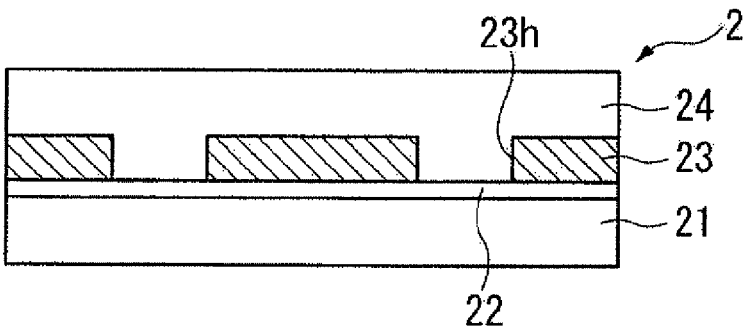

By doing this, single crystal silicon carbide is epitaxially grown using each of the portions of the silicon carbide film 22 exposed in the openings 23h as a starting point, whereby a single crystal silicon carbide film 24 covering the silicon carbide film 22 exposed in the openings 23h and the mask material 23 is formed (a fourth step, see FIG. 7D).

By the above steps, a semiconductor substrate 2 of this embodiment can be produced.

According to the semiconductor substrate 2 and the method for producing a semiconductor substrate of this embodiment, planar defects occurring in the interface between the single crystal silicon 21 and the single crystal silicon carbide film 24 propagate into an upper layer accompanying the growth of single crystal silicon carbide and reach a side wall of the opening 23h of the mask material 23 and disappear. Further, the viscosity of the mask material 23 is decreased in a temperature range of 950 to 1400° C. (for example, a temperature range in which the single crystal silicon carbide film 24 is formed), and therefore, stress caused by a difference in the thermal expansion coefficient of the single crystal silicon carbide film 24 can be absorbed by the mask material 23. Further, since the viscosity of the mask material 23 is low, at the time of completion of the process, stress due to a difference in the thermal expansion coefficient of the single crystal silicon carbide film 24 occurring when the substrate temperature is decreased can be also absorbed by the mask material 23. Accordingly, a high-quality single crystal silicon carbide film 24 with few crystal defects can be formed. Further, in the method for producing a semiconductor substrate, if the temperature range in which the single crystal silicon carbide film 24 is epitaxially grown is within the above-described range, a high-quality single crystal silicon carbide film with few crystal defects can be reliably formed.

Further, the viscosity of the mask material 23 is reliably decreased in a temperature range of 950 to 1400° C. Accordingly, if the content of the doped impurity is in the above-described range, a high-quality single crystal silicon carbide film 24 with few crystal defects can be reliably formed.

First Modification Example

FIGS. 8A to 8C and FIGS. 9A to 9E are process drawings showing a first modification example of the method for producing a semiconductor substrate according to the second embodiment.

First, single crystal silicon 21 is provided and the single crystal silicon is placed in a vacuum chamber. Then, a heat treatment is performed in a vacuum atmosphere under the conditions that a treatment temperature is 750° C. and a treatment time is 5 minutes. Subsequently, the treatment temperature is decreased to 600° C.

Subsequently, the substrate temperature is adjusted to a temperature in a range of 600 to 800° C., and a raw material gas (a carbon material gas) for a silicon carbide film 22 is introduced into the chamber while maintaining this adjusted substrate temperature. By doing this, the silicon carbide film 22 is formed on a surface of the single crystal silicon 21 (a first step, see FIG. 8A).

Figure 8A:
FIGS. 8A to 8C are process drawings showing a first modification example of the method for producing a semiconductor substrate according to the second embodiment of the invention.
Figure 8B:
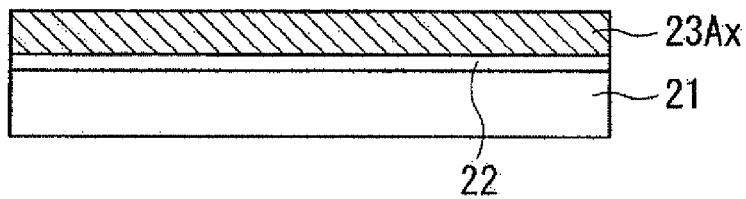

Subsequently, a silicon oxide film 23Ax is formed on a surface of the silicon carbide film 22 (a second step, see FIG. 8B).

Figure 8C:
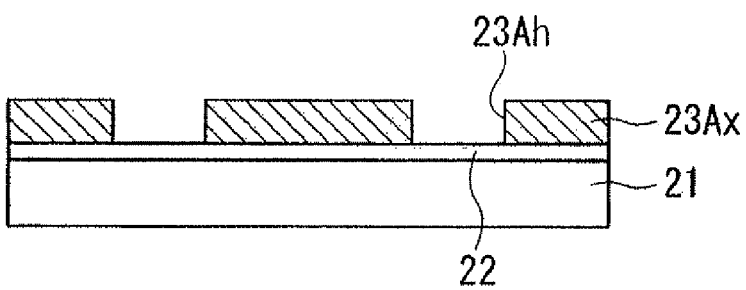

Subsequently, the silicon oxide film 23Ax is patterned to form openings 23Ah, thereby exposing portions of the surface of the silicon carbide film 22 (a third step, see FIG. 8C).

Subsequently, the single crystal silicon 21 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained for a predetermined time.

Figure 9A:
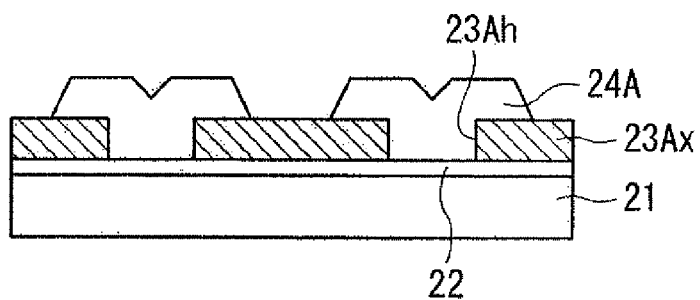
FIGS. 9A to 9E are process drawings showing the first modification example of the method for producing a semiconductor substrate continued from FIG. 8C.
Figure 9B:
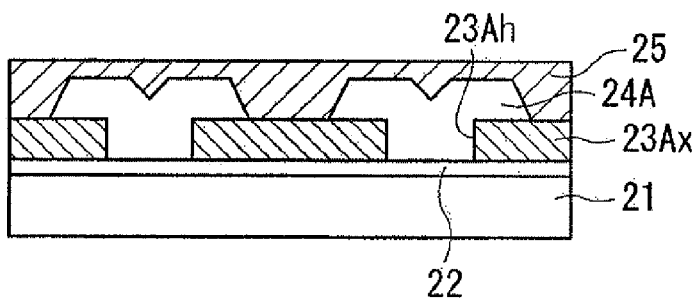
Figure 9C:
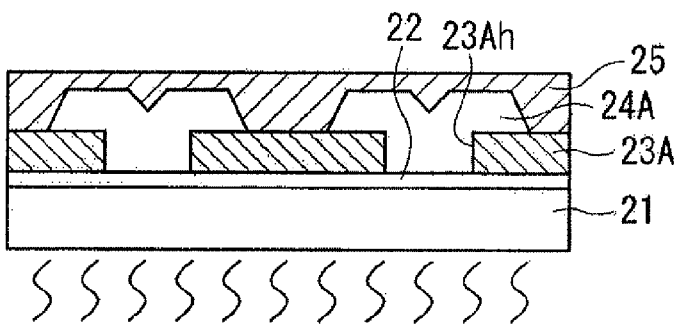
Figure 9D:
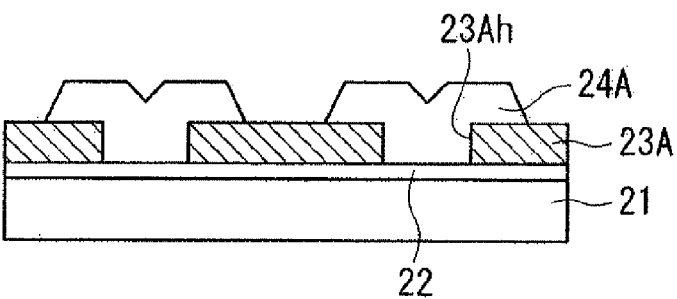

By doing this, single crystal silicon carbide is epitaxially grown using the silicon carbide film 22 exposed in the openings 23Ah as a starting point, and the epitaxial growth of the single crystal silicon carbide is stopped when the surface of the silicon oxide film 23Ax is in such a state that portions thereof are exposed (a fourth step, see FIG. 9A).

Subsequently, the silicon oxide film 23Ax is doped with an impurity (a fifth step). For example, the fifth step includes: a step of forming an impurity-containing layer 25 doped with an impurity so as to cover the silicon oxide film 23Ax after decreasing the substrate temperature to a predetermined temperature (a seventh step, see FIG. 9B); a step of forming a mask material 23A by diffusing the doped impurity in the impurity-containing layer 25 into the silicon oxide film 23Ax by heating the single crystal silicon 21 (an eighth step, see FIG. 9C); and a step of removing the impurity-containing layer 25, thereby exposing the mask material 23A (a ninth step, see FIG. 9D).

The impurity is phosphorus, and the impurity-containing layer 25 is formed such that phosphorus is contained in a silicon oxide film in an amount ranging from 1 to 8 wt %. Boron may be used as the impurity.

Then, the single crystal silicon 21 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained.

The viscosity of the mask material 23A is $10^5$ Pa·S or more and $10^{14.5}$ Pa·S or less when the carbonization treatment temperature is in a range of 950 to 1400° C. In this modification example, phosphorus is diffused into the silicon oxide film 23Ax in an amount ranging from 1 to 8 wt %, and therefore, the viscosity of the mask material 23A satisfies a value of $10^{7.6}$ Pa·S or more and $10^{13}$ Pa·S or less in a temperature range of 950 to 1400° C.

Figure 9E:
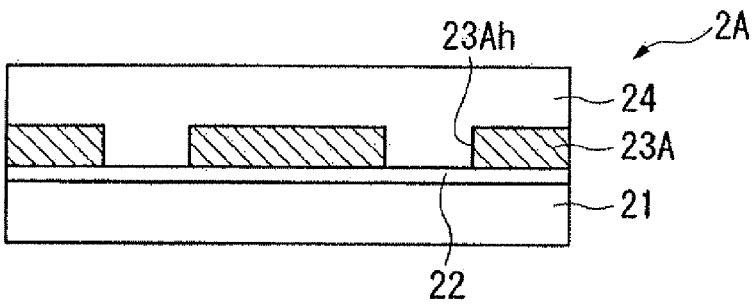

By doing this, the epitaxial growth of the single crystal silicon carbide 24A whose epitaxial growth was stopped is restarted, whereby a single crystal silicon carbide film 24 covering the mask material 23A is formed (a sixth step, see FIG. 9E).

By the above steps, a semiconductor substrate 2A of this modification example can be produced.

According to the method for producing a semiconductor substrate of this modification example, in the process of forming the silicon oxide film 23Ax into the mask material 23A (decreasing the viscosity) on the way to the formation of the single crystal silicon carbide film 24, at the initial stage of epitaxially growing the single crystal silicon carbide film 24, stress caused by a difference in the thermal expansion coefficient of the single crystal silicon carbide film 24 can be absorbed by the mask material 23A. Further, since the viscosity of the mask material 23A is low, at the time of completion of the process, stress due to a difference in the thermal expansion coefficient of the single crystal silicon carbide film 24 occurring when the substrate temperature is decreased can be also absorbed by the mask material 23A. Accordingly, a high-quality single crystal silicon carbide film 24 with few crystal defects can be formed.

Further, according to this method, the impurity is selectively diffused into the silicon oxide film 23Ax, and therefore, it is possible to prevent the single crystal silicon carbide 24A from being doped with the impurity during the epitaxial growth. Accordingly, a high-purity single crystal silicon carbide film 24 containing no impurities can be formed.

Further, according to this method, the doped phosphorus in the impurity-containing layer 25 can be sufficiently diffused into the silicon oxide film 23Ax in the eighth step. Therefore, the viscosity of the mask material 23A can be reliably decreased in a temperature range of 950 to 1400° C. Accordingly, if the content of the doped impurity is in the above-described range, a high-quality single crystal silicon carbide film 24 with few crystal defects can be reliably formed.

Second Modification Example

Figure 10A:
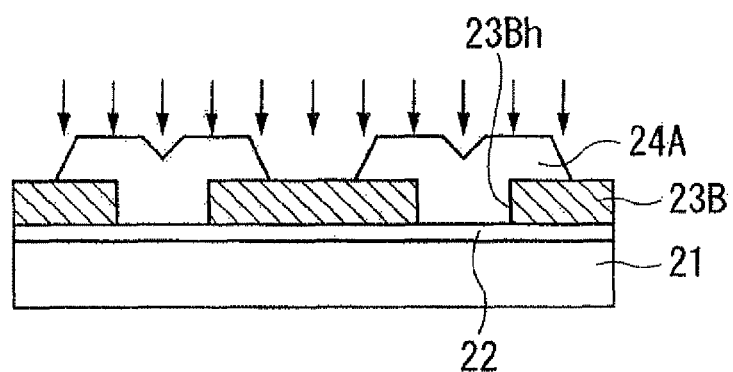
FIGS. 10A and 10B are process drawings showing a second modification example of the method for producing a semiconductor substrate according to the second embodiment of the invention.
Figure 10B:
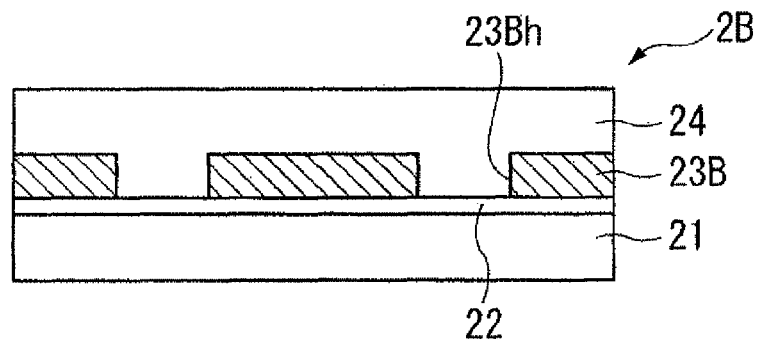

FIGS. 10A and 10B are process drawings showing a second modification example of the method for producing a semiconductor substrate according to the second embodiment.

The first step to the fourth step of the method for producing a semiconductor substrate according to this modification example are the same as the first step to the fourth step of the method for producing a semiconductor substrate according to the first modification example described above (FIGS. 8A to 8C and FIG. 9A), and therefore, the detailed description thereof is omitted.

Subsequent to the fourth step, a silicon oxide film is doped with an impurity (a fifth step, see FIG. 10A). For example, in the fifth step, a mask material 23B can be formed by doping the silicon oxide film with phosphorus in an amount ranging from 1 to 8 wt % by ion implantation or the like. Boron may be used as the impurity.

Then, the single crystal silicon 21 is heated in a carbon material gas atmosphere and the substrate temperature is increased to a carbonization treatment temperature. The carbonization treatment temperature is adjusted to a temperature in a range of 950 to 1400° C. and the adjusted carbonization treatment temperature is maintained.

The viscosity of the mask material 23B is $10^5$ Pa·S or more and $10^{14.5}$ Pa·S or less when the carbonization treatment temperature is in a range of 950 to 1400° C. In this modification example, phosphorus is contained in the mask material 23B in a range of 1 to 8 wt %, and therefore, the viscosity of the mask material 23B satisfies a value of $10^{7.6}$ Pa·S or more and $10^{13}$ Pa·S or less in a temperature range of 950 to 1400° C.

By doing this, the epitaxial growth of the single crystal silicon carbide 24A whose epitaxial growth was stopped is restarted, whereby a single crystal silicon carbide film 24 covering the mask material 23B is formed (a sixth step, see FIG. 10B).

By the above steps, a semiconductor substrate 2B of this modification example can be produced.

According to the method for producing a semiconductor substrate of this modification example, the viscosity of the mask material 23B can be reliably decreased in a temperature range of 950 to 1400° C. Accordingly, if the content of the doped impurity is in the above-described range, a high-quality single crystal silicon carbide film 24 with few crystal defects can be reliably formed. Further, an impurity may be sometimes doped also into the single crystal silicon carbide 24A during the epitaxial growth, however, such a case is effective in a case of forming a layer using a layer containing an impurity on the single crystal silicon carbide film 24 or a case of laminating the same type of layer thereon.

The entire disclosure of Japanese Patent Application No. 2011-059273, filed Mar. 17, 2011 is expressly incorporated by reference herein.

What is claimed is:

1. A semiconductor substrate comprising:
   single crystal silicon;
   a mask material disposed on a surface of the single crystal silicon, the mask material having an opening and being comprised of an oxide doped with boron, an amount of boron in the mask material being in a range of 1 to 4 wt %;
   a silicon carbide film disposed on a portion of the single crystal silicon, the portion being in the opening; and
   a single crystal silicon carbide film disposed so as to cover the silicon carbide film and the mask material,
   the mask material having a viscosity of $10^5$ Pa·S or more and $10^{14.5}$ Pa·S or less at a temperature in a range of 950 to 1400° C.

2. A semiconductor substrate comprising:
   single crystal silicon;
   a silicon carbide film disposed on a surface of the single crystal silicon;
   a mask material disposed on a surface of the silicon carbide film, the mask material having an opening and being comprised of an oxide doped with boron, an amount of boron in the mask material being in a range of 1 to 4 wt %; and
   a single crystal silicon carbide film disposed so as to cover the silicon carbide film and the mask material,
   the mask material having a viscosity of $10^5$ Pa·S or more and $10^{14.5}$ Pa·S or less at a temperature in a range of 950 to 1400° C.

3. The semiconductor substrate according to claim 1, the mask material being a silicon oxide film that contains phosphorous, an amount of the phosphorous being in a range from 1 to 8 wt %.

4. A method for producing a semiconductor substrate, comprising:
   forming a mask material on a surface of single crystal silicon, the mask material being comprised of an oxide doped with boron, an amount of boron in the mask material being in a range of 1 to 4 wt %;
   forming an opening in the mask material, thereby exposing a portion of the single crystal silicon;
   forming a silicon carbide film on the portion of the single crystal silicon; and
   forming a single crystal silicon carbide film covering the silicon carbide film and the mask material by epitaxially growing single crystal silicon carbide in a temperature range of 950 to 1400° C. using the silicon carbide film as a starting point, wherein the mask material has a viscosity of $10^5$ Pa·S or more and $10^{14.5}$ Pa·S or less in a temperature range of 950 to 1400° C.

5. A method for producing a semiconductor substrate, comprising:
   forming a silicon oxide film on a surface of single crystal silicon;
   forming an opening in the silicon oxide film, thereby exposing a portion of the single crystal silicon;
   forming a silicon carbide film on the portion of the single crystal silicon;
   epitaxially growing single crystal silicon carbide using the silicon carbide film as a starting point and stopping the epitaxial growth of the single crystal silicon carbide in a state that a portion of the surface of the silicon oxide film is exposed;

forming a mask material by doping the silicon oxide film with boron, an amount of boron in the mask material being in a range of 1 to 4 wt %; and forming a single crystal silicon carbide film covering the mask material in a temperature range of 950 to 1400° C. by restarting the epitaxial growth of the single crystal silicon carbide after the forming of the mask material, wherein the mask material has a viscosity of $10^5$ Pa·S or more and $10^{14.5}$ Pa·S or less in a temperature range of 950 to 1400° C.

6. A method for producing a semiconductor substrate, comprising:

forming a silicon carbide film on a surface of single crystal silicon;

forming a mask material on a surface of the silicon carbide film, the mask material being comprised of an oxide doped with boron, an amount of boron in the mask material being in a range of 1 to 4 wt %;

forming an opening in the mask material, thereby exposing a portion of the silicon carbide film; and forming a single crystal silicon carbide film covering the silicon carbide film and the mask material by epitaxially growing single crystal silicon carbide in a temperature range of 950 to 1400° C. using the portion of the silicon carbide film as a starting point, wherein the mask material has a viscosity of $10^5$ Pa·S or more and $10^{14.5}$ Pa·S or less in a temperature range of 950 to 1400° C.

7. A method for producing a semiconductor substrate, comprising:

forming a silicon carbide film on a surface of single crystal silicon;

forming a silicon oxide film on a surface of the silicon carbide film;

forming an opening in the silicon oxide film, thereby exposing a portion of the silicon carbide film;

epitaxially growing single crystal silicon carbide using the portion of the silicon carbide film as a starting point, and the epitaxial growth of the single crystal silicon carbide is stopped in a state that a portion of the surface of the silicon oxide film is exposed;

forming a mask material by doping the silicon oxide film with boron, an amount of boron in the mask material being in a range of 1 to 4 wt %; and forming a single crystal silicon carbide film covering the mask material in a temperature range of 950 to 1400° C. by restarting the epitaxial growth of the single crystal silicon carbide after the forming of the mask material, wherein the mask material has a viscosity of $10^5$ Pa·S or more and $10^{14.5}$ Pa·S or less in a temperature range of 950 to 1400° C.

8. The method for producing a semiconductor substrate according to claim 4, wherein the mask material is formed of a silicon oxide film containing phosphorous in an amount ranging from 1 to 8 wt %.

9. The method for producing a semiconductor substrate according to claim 5, wherein the forming of the mask material comprises:

forming an impurity-containing layer doped with an impurity and covering the silicon oxide film;

forming the mask material by diffusing the doped impurity in the impurity-containing layer into the silicon oxide film by heating the impurity-containing layer; and removing the impurity-containing layer, thereby exposing the mask material.

* * * * *